(12) United States Patent
Eytcheson et al.

(10) Patent No.: US 6,918,437 B2
(45) Date of Patent: Jul. 19, 2005

(54) HEATSINK BUFFER CONFIGURATION

(75) Inventors: Charles T. Eytcheson, Kokomo, IN (US); Larry William Houk, Kokomo, IN (US); Rick B. Mummert, Flora, IN (US)

(73) Assignee: Delphi Technologies, Inc., Troy, MI (US)

( * ) Notice: Subject to any disclaimer, the term of this patent is extended or adjusted under 35 U.S.C. 154(b) by 40 days.

(21) Appl. No.: 10/102,341

(22) Filed: Mar. 21, 2002

(65) Prior Publication Data

US 2003/0178177 A1 Sep. 25, 2003

(51) Int. Cl.[7] .................................................. F28F 7/00
(52) U.S. Cl. ....................... 165/185; 165/80.3; 257/720; 361/704
(58) Field of Search ................................ 165/185, 80.3, 165/80.2, 76, 146; 361/702, 704, 712; 257/720, 7

(56) References Cited

U.S. PATENT DOCUMENTS

| 3,735,485 | A | * | 5/1973 | Wilson ........................ 257/720 |
| 5,617,294 | A | * | 4/1997 | Watson et al. .............. 361/719 |
| 5,886,407 | A | * | 3/1999 | Polese et al. ................ 257/706 |
| 6,064,573 | A | * | 5/2000 | Morton ........................ 361/704 |
| 6,114,048 | A | * | 9/2000 | Jech et al. ................... 428/547 |
| 6,188,579 | B1 | * | 2/2001 | Buondelmonte et al. .... 361/719 |
| 6,262,477 | B1 | * | 7/2001 | Mahulikar et al. .......... 257/698 |
| 6,295,200 | B1 | * | 9/2001 | Schmidt ...................... 361/704 |
| 6,355,362 | B1 | * | 3/2002 | Jones et al. ................. 428/614 |
| 6,411,516 | B1 | * | 6/2002 | Palumbo et al. ............ 361/704 |

* cited by examiner

*Primary Examiner*—Tho V Duong
(74) *Attorney, Agent, or Firm*—Stefan V. Chmielewski

(57) ABSTRACT

A heat sink buffer 10 is provided, including a backplate 20 defining a heat transfer passage 24. A thermally conductive buffer element 22 is positioned within and secured to the heat transfer passage 24 to provide a thermal conduit through the backplate 20.

4 Claims, 2 Drawing Sheets

HEATSINK BUFFER CONFIGURATION

TECHNICAL FIELD

The present invention relates generally to an improved heatsink configuration and more particularly to an improved heatsink configuration with a conductive buffer.

BACKGROUND OF THE INVENTION

Electronics assemblies are formed in a wide variety of configurations for a wide variety of applications. Often, however, they are comprised of a plurality of individual electronic components mounted on a circuit board or other substrate. The individual electronic components typically communicate electronically with each other through the substrate to form a useful electronic assembly. Although the individual electronic components themselves may come in a wide variety of embodiments, one particular type is commonly referred to as a power device. Power devices are electronic components that generate heat during operation. Commonly, the thermal energy generated by these power devices must be dissipated in order for the electronic assembly to function properly. Some power devices must be kept within a predetermined thermal range in order to reliably perform their function. Others, while able to withstand larger temperature ranges, may damage the substrate or neighboring electronic components if the thermal energy is not properly dissipated.

Numerous approaches have been developed in order to dissipate heat from these power devices. Various combinations of convection and radiation transfer have been utilized to transfer the thermal energy from the power devices. One well-known and successful approach has been through the use of a heatsink device. Heatsink elements provide a thermal well, also known as a coldplate, to absorb the heat generated by power devices. The coldplate often takes the form of large blocks of metal, or other thermal conductive material, with the capability of absorbing the thermal energy from the power devices and dissipating it over a larger surface area. The specific configuration of such coldplates is virtually limitless, although common embodiments such as metal blocks, cases, and heat rail brackets are well known. Although the coldplate may be modified into a variety of forms, thermal communication between the coldplate and the power devices often requires careful design consideration.

One approach to providing communication between the heatsink element and the power devices has been weld a conductive buffer, such as copper, to a backplate (often aluminum). The conductive buffer provides an effective surface to thermally mount the power device, while the backplate creates a resilient structure capable of mounting to the coldplate. Heat generated by the power device is transferred through the conductive buffer, through the weld nugget, through the backplate and into the coldplate. Although this design has been widely utilized, it does present several undesirable design characteristics. Materials, such as copper, that are high in thermal conductivity are desirable for direct communication with the power device. This ensures that heat is quickly and easily pulled from the power device. These high conductivity materials, however, often lack the structural resilience necessary to form a mountable backplate. The backplate, in turn, while structurally resilient, is often of a material such as aluminum which may not share the high thermal conductivity desired of the buffer.

The resultant present method, therefore, leaves significant room for improvement. The effectiveness of the high thermal conductivity of the buffer can be reduced by the impact of the backplate. This can be further impacted by the weld nugget often used to attach the buffer to the backplate. The weld nugget is commonly smaller than the conductive buffer plate, and therefore the cross-sectional area of thermal communication between the buffer plate and the backplate is reduced. This creates a negative impact on the thermal conductivity of the heat-sink stack as a whole. It would be preferable to minimize any negative impact on the thermal conductivity, or even improve conductivity, while retaining the structural resilience associated with present designs. It would also be desirable to create possible reductions in manufacturing time and cost through the elimination of the weld nugget utilized in present designs. This would also realize an improvement over the thermal conductivity reduction associated with present weld nugget usage.

SUMMARY OF THE INVENTION

It is, therefore, an object of the present invention to provide a heat sink buffer configuration that improves thermal conductivity between a heat source and a coldplate. It is a further object of the present invention to provide a heat sink buffer configuration with improved manufacturing and assembly characteristics.

In accordance with the objects of the present invention, a heat sink buffer configuration is provided. The heat sink buffer includes a backplate defining a heat transfer passage. The heat sink buffer further includes a thermally conductive buffer element positioned within the heat transfer passage and formed to fit the heat transfer passage. The heat sink buffer, thereby creates an uniform thermal passageway through the backplate.

Other objects and features of the present invention will become apparent when viewed in light of the detailed description of the preferred embodiment when taken in conjunction with the attached drawings and appended claims.

DESCRIPTION OF THE PREFERRED EMBODIMENT(S)

Figure 1:
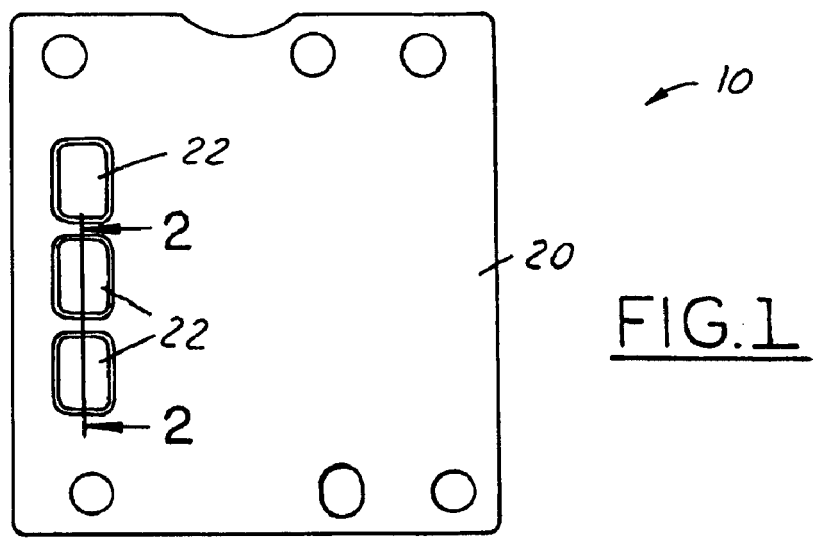
FIG. 1 is an illustration of an embodiment of an heat sink buffer configuration in accordance with the present invention.

Referring now to FIG. 1, which is an illustration of a heat sink buffer configuration 10 in accordance with the present invention. Heat sink buffers 10 are well known in the prior art and are commonly utilized to provide thermal communication between a heat generating device 12 and a coldplate 14 (see FIG. 2). A wide variety of both heat generating devices 12 and cold-plate 14 designs are well known by the prior art and contemplated by the present invention. In one common embodiment, the heat generating device 12 is an electronic component 16 mounted on a substrate 18. Often these components generate excess heat that must be properly dissipated in order for the electronic component 16 to function properly. The thermal energy is therefore transferred out of the electronic component 16 and into the cold-plate 14. Heat sink buffers 10 are utilized to provide both a thermal mounting surface for the electronic component 16 as well as provide a thermal communication link to the cold-plate 14.

The heat sink buffer 10 includes a backplate 20 and a thermally conductive buffer element 22. In prior designs, the thermally conductive buffer element 22 was simply a conductive plate mounted to the surface of the backplate 20. The thermally conductive buffer element 22 was used primarily as an effective surface for thermally mounting the heat generating device 12 while the heat was transferred from the conductive plate through the backplate 20 to the cold-plate 14. The present invention provides an improved heat sink buffer 10 by including a heat transfer passage 24 defined by the backplate 20. The heat transfer passage 24 is a void (or bore) completely through the backplate 20. The heat transfer passage 24 is contemplated to be formed in a variety of shapes and sizes. The heat transfer passage 24 allows the thermally conductive buffer element 22 to provide a direct thermal connection between the heat generating device 12 and the cold-plate 14 and thereby improves the thermal transfer efficiency of the heat sink buffer 10. The thermally conductive buffer element 22 can be formed using a material optimized for thermal conductivity while the backplate 20 can be formed using a material that provides suitable structural integrity. Although a variety of materials may be used to form the thermally conductive buffer element 22 and the backplate 20, in one embodiment the thermally conductive buffer element 22 is formed using copper and the backplate 20 is formed using aluminum.

Figure 2:
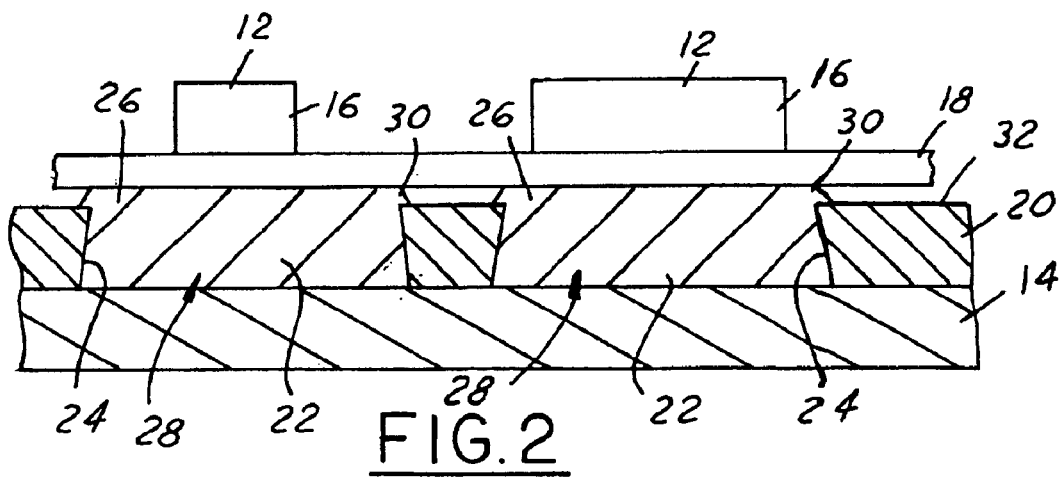
FIG. 2 is a cross-sectional illustration of the heat sink buffer configuration illustrated in FIG. 1, the cross-section taken along the lines 2—2 in the direction of the arrows.
Figure 3:
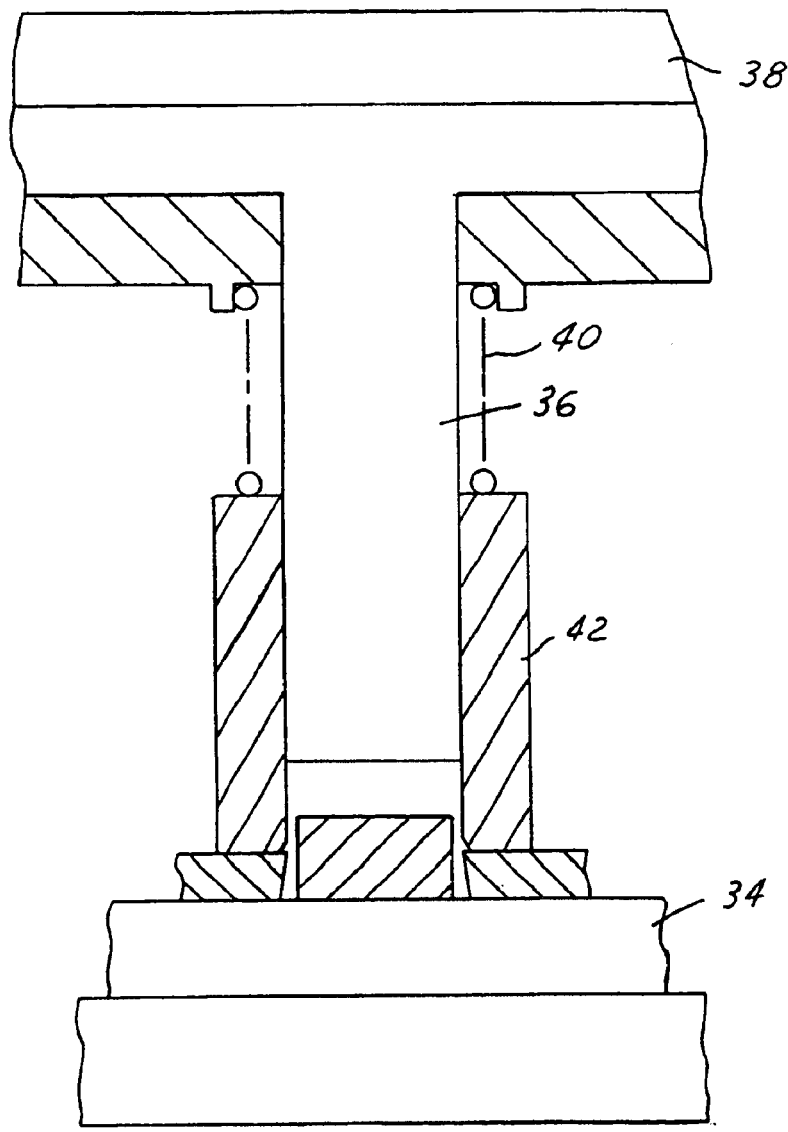
FIG. 3 is an cross-sectional illustration a method of manufacturing a heat sink buffer configuration in accordance with the present invention.

In addition utilizing an improved and uniform thermally conductive conduit, the present invention represents further improvements over the prior art. The present invention contemplates swaging the thermally conductive buffer element 22 to secure it within the heat transfer passage 24 of the backplate 20. This can result in simplified manufacturing processes and reduced manufacturing costs. In addition, the thermal transfer variation often associated with the size and thermal conductivity of weld nuggets, often utilized in prior methods, has been eliminated. Although it is contemplated that the thermally conductive buffer element 22 and the backplate 20 may be swaged together in a variety of methods, one embodiment is illustrated in FIGS. 2 and 3. The heat transfer passage 24 in this embodiment has a first end 26 and a second end 28. A breakout area 44 is formed by making the cross-sectional area of the second end 28 greater than the cross sectional area of the first end 26. The thermally conductive buffer element 22 is positioned within the heat transfer passage 24 such that an upper portion 30 extends above the first end 26. When swaged, the thermally conductive buffer element 22 fills the heat transfer passage 24 and extends over the upper surface 32 of the backplate 20. This has the effect of securing the thermally conductive buffer element 22 within the heat transfer passage 24.

Although the thermally conductive buffer element 22 may be swaged to secure it to the backplate 20 in a variety of fashions and methods, one method is illustrated in FIG. 3. The methods utilizes a hard tack surface 34 and a punch 36 positioned between a pair of shoes 38. The thermally conductive buffer element 22, while in a preform slug state, and the backplate 20 are positioned between the hard tack surface 34 and the punch 36. As the shoes 38 are pressed together, the punch 36 presses down on the thermally conductive buffer element 22 and swages it into the backplate 20 to result in a combination thermally conductive buffer element 22 and backplate 20 illustrated in FIG. 2. A spring element 40 and sleeve 42 may be utilized to secure the heat sink buffer 10 assembly during the swaging process. The present method of assembly can represent a quick and cost effective manufacturing process. Although a particular method and assembly has been described for swaging the heat sink buffer 10 assembly, it should be understood that a wide variety of approaches would be obvious to one skilled in the art when apprised of the present invention. In addition, although the process has been described as swaging the thermally conductive buffer element 22 into the backplate 20, it should be understood that the present invention contemplates swaging the backplate 20 into the thermally conductive buffer element 22 as well.

Figure 4:
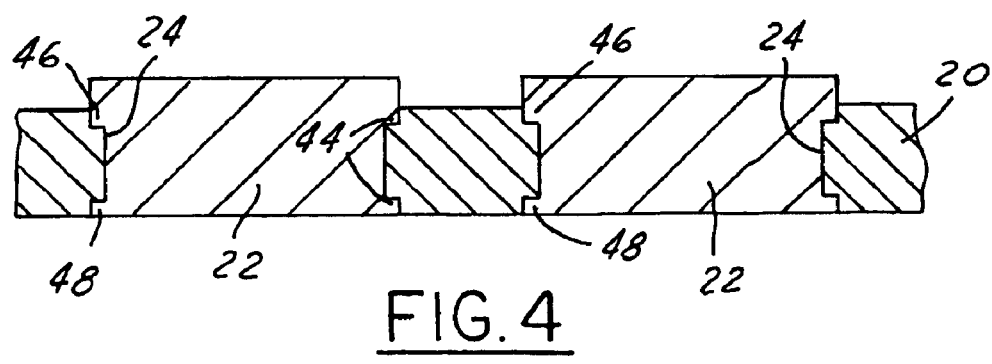
FIG. 4 is an illustration of an embodiment of a heat sink buffer configuration in accordance with the present invention.

Similarly, the formation of the heat transfer passage 24 may take on a variety of forms. An alternate embodiment, for illustrative purposes, is shown in FIG. 4. Wherein breakout areas 44 were formed in the previous embodiment (FIG. 2) by increasing the cross-sectional area of the second end 28, the breakout areas 44 in alternate embodiments may be formed in a variety of shapes and sizes. The breakout areas 44 in FIG. 4 are formed on both the first end 26 and the second end 28. The thermally conductive buffer element 22 fills both an upper breakout area 46 and an lower breakout area 48 during the swaging process and thereby secures itself to the backplate 20.

Figure 5:
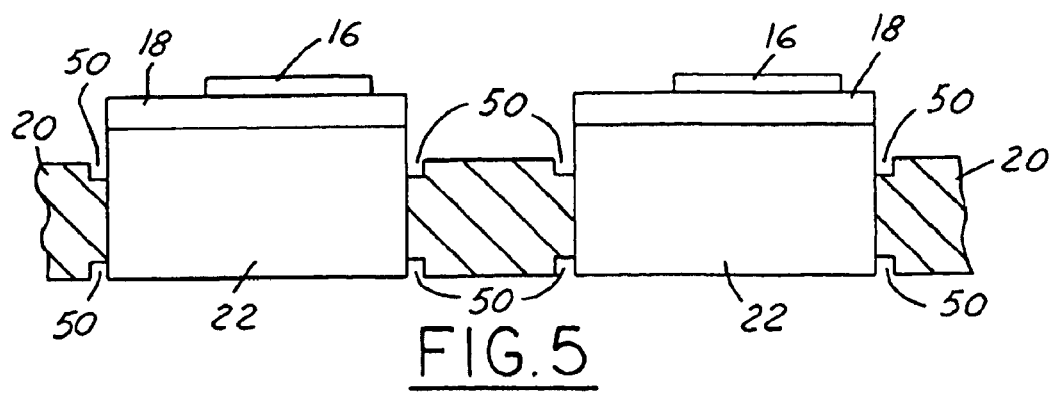
FIG. 5 is an illustration of an embodiment of a heat sink buffer configuration in accordance with the present invention, the embodiment illustrating a swaged backplate securing the thermally conductive buffer element.

In still another embodiment illustrated in FIG. 5, it is contemplated that the backplate 20 may be swaged to secure the thermally conductive buffer element 22 within the heat transfer passage 24. In a similar process to that described to swage the thermally conductive buffer element 22, the backplate 20 itself may be swaged to create the connection. A swage zone 50 on either side of the backplate 20 is swaged (compressed) and thereby expands the backplate 20 into the heat transfer passage 24 to secure the thermally conductive buffer element 22. Although a variety of methods and forms of swaging are contemplated, in one embodiment, the swage zones 50 surround the periphery of the thermally conductive buffer element 22. This in effect creates an hourglass shape that retains the thermally conductive buffer element 24 within the heat transfer passage 24.

While the invention is described in connection with one or more embodiments, it is to be understood that specific mechanisms and techniques which have been described are merely illustrative of the principles of the invention. Numerous modifications may be made to the methods and apparatus described without departing from the spirit and scope of the invention as defined and described by the appended claims.

What is claimed is:
1. A heat sink buffer comprising:
   a backplate formed of a first metal, said backplate having an uppermost surface and defining a heat transfer passage having a first end and a second end; and
   a thermally conductive buffer element formed of a second metal distinct from said first metal, said thermally conductive buffer element being positioned within said heat transfer passage in intimate contact therewith and including an upper portion, said upper portion covering a portion of said uppermost surface.

2. A heat sink buffer as described in claim 1 wherein said breakout area is formed in said second end.

3. A heat sink buffer as described in claim 1 wherein said thermally conductive buffer element comprises copper.

4. A heat sink buffer as described in claim 1 wherein said backplate comprises aluminum.

* * * * *